(12) United States Patent
Atsumi

(10) Patent No.: US 8,686,797 B2
(45) Date of Patent: Apr. 1, 2014

(54) PHASE LOCKED LOOP CIRCUIT AND COMMUNICATION DEVICE

(75) Inventor: Ken Atsumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/975,442

(22) Filed: Dec. 22, 2010

(65) Prior Publication Data

US 2011/0156824 A1    Jun. 30, 2011

(30) Foreign Application Priority Data

Dec. 24, 2009    (JP) .................................. 2009-293488

(51) Int. Cl.
*H03L 7/06* (2006.01)
(52) U.S. Cl.
USPC .................................................. 331/17; 327/2
(58) Field of Classification Search
USPC .................... 331/17; 327/2, 12, 157
See application file for complete search history.

(56) References Cited

U.S. PATENT DOCUMENTS

| 5,307,071 | A | 4/1994 | Arnold et al. |
| 5,629,649 | A | 5/1997 | Ujiie |
| 7,109,806 | B2 * | 9/2006 | Hsu et al. ........................ 331/25 |
| 2009/0289673 | A1 * | 11/2009 | Chiu ............................. 327/157 |

FOREIGN PATENT DOCUMENTS

| JP | 49-30314 | 8/1974 |
| JP | 60-069916 | 4/1985 |
| JP | 64-078524 | 3/1989 |
| JP | 04-061421 | 2/1992 |
| JP | 05-90962 A | 4/1993 |
| JP | 05-110432 | 4/1993 |
| JP | 06-045929 | 2/1994 |
| JP | 08-146166 | 6/1996 |
| JP | 08-148994 | 6/1996 |
| JP | 08-162948 A | 6/1996 |
| JP | 2002-141800 | 5/2002 |
| JP | 2007-068081 | 3/2007 |

OTHER PUBLICATIONS

Japanese Office Action mailed Nov. 5, 2013 for corresponding Japanese Application No. 2009-293488, with partial English-language translation.

* cited by examiner

*Primary Examiner* — Joseph Chang
(74) *Attorney, Agent, or Firm* — Fujitsu Patent Center

(57) ABSTRACT

There is provided a phase locked loop circuit which includes a frequency divider, a phase comparator, a filter, and an output signal oscillator. The frequency divides a feedback signal by a specific ratio and the feedback signal is used for synchronizing a phase of a reference signal and a phase of an output signal. The phase comparator compares the phases of the reference signal, the output signal, and the feedback signal and adjusts a gain of an analog signal used for generating the output signal in accordance with increase or decrease of the ratio. The filter filters the analog signal to pass signals in a specific frequency band, the gain of the analog signal having been adjusted by the phase comparator and the output signal oscillator outputs the output signal on the basis of the analog signal.

7 Claims, 9 Drawing Sheets

PHASE LOCKED LOOP CIRCUIT AND COMMUNICATION DEVICE

CROSS-REFERENCE TO RELATED APPLICATION

This application is based upon and claims the benefit of priority of the prior Japanese Patent Application No. 2009-293488, filed on Dec. 24, 2009 the entire contents of which are incorporated herein by reference.

FIELD

The embodiments discussed herein are related to a phase locked loop circuit and a communication device.

BACKGROUND

Phase locked loop (PLL) circuits have been used in wireless devices, optical transmission devices and other devices for mobile communication, video transmission, digital TV broadcasting and other purposes to produce stable output of wide-band frequency signals. For example, in a wireless communication technology applied to mobile phones, personal handyphone systems (PHS) or wireless local area networks (LAN), data is carried on a carrier of a frequency oscillated by the PLL circuit to form radio waves, which are transmitted and received to establish communications.

In the wireless communication technology, multiple lines of data may be accurately transmitted and received while the PLL circuit properly changing frequencies of the carrier. Hereinafter, an exemplary related art PLL circuit will be described with reference to FIG. 8. As illustrated in FIG. 8, the PLL circuit includes a phase comparator, a loop filter, a voltage controlled oscillator (VCO) and a feedback frequency divider.

The PLL circuit synchronizes a phase of a signal self-oscillated by the VCO to a phase of REFCLK, which is a PLL input reference signal, and outputs a signal following REFCLK ("PLL output"). In particular, a phase comparator compares a phase of REFCLK with a phase of FBCLK which is a signal oscillated by the VCO and outputs a phase difference between REFCLK and FBCLK to a loop filter as a difference signal. The loop filter filters the difference signal input from the phase comparator and outputs the filtered difference signal to the VCO. The VCO oscillates at a frequency determined in accordance with the difference signal output from the phase comparator via the loop filter and outputs a signal. The loop filter illustrated in FIG. 8 is a low pass filter (LPF) which filters out high-frequency components in the input signal.

The frequency of the signal oscillated by the VCO is divided by feedback frequency divider by a predetermined frequency division ratio and the frequency divided signal is output as FBCLK to the phase comparator. As a result, the PLL circuit may output a signal of a frequency as the frequency division ratio times the frequency of REFCLK. In this manner, the PLL circuit can output a frequency-divided or frequency-multiplied signal of REFCLK. That is, the PLL circuit generates various frequencies in synchronization with the input signal REFCLK to thereby enable accurate transmission and reception of multiple lines of data.

In recent years, there have been disclosed a PLL circuit which reduces phase errors between the reference signal REFCLK and the frequency-divided signal FBCLK (for example, Japanese Laid-open Patent Publication No. 08-162948) and a PLL circuit which rapidly switches output frequencies without a loop filter have been developed (for example Japanese Laid-open Patent Publication No. 05-90962).

SUMMARY

According to an aspect of the invention, a phase locked loop circuit includes a frequency divider configured to divide a feedback signal by a specific ratio, the feedback signal being used for synchronizing a phase of a reference signal and a phase of an output signal; a phase comparator configured to compare the phases of the reference signal, the output signal, and the feedback signal and to adjust a gain of an analog signal, the analog signal being used for generating the output signal in accordance with increase or decrease of the ratio; a filter configured to filter the analog signal to pass signals in a specific frequency band, the gain of the analog signal having been adjusted by the phase comparator; and an output signal oscillator configured to generate the output signal on the basis of the analog signal filtered by the filter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The PLL circuits described above, however, have a potential problem that following capability decreases during the switching of the output frequencies. The reason causing the problem will be explained followings.

Equation 1 represents an output frequency $f_{OUT}$ of a PLL-output signal.

$$f_{OUT} = f_{IN} \times N_{DIV} \text{ [Hz]} \tag{1}$$

In this equation, $f_{OUT}$, $f_{IN}$, and $N_{DIV}$ re an output frequency of the PLL input signal, a frequency of REFCLK, and the feedback frequency division ratio, respectively.

As described in Equation 1, the output frequency $f_{OUT}$ is obtained by multiplying the feedback division ratio $N_{DIV}$ by the frequency of REFCLK $f_{IN}$. Thus, in a related art PLL circuit, it is necessary to change the feedback division ratio $N_{DIV}$ to switch the output frequency if the input signal has a constant frequency.

Since the PLL circuit includes a feedback control circuit, a PLL circuit control loop characteristic H(s) is expressed by Equation 2, where H(s) is obtained by using a transfer function of a closed loop and relates to response speed and stability of a loop in the PLL circuit. In the following Equation 2, $K_P$, F(s), and $K_V$ are a gain of a phase comparator, a transfer function of the loop filter, frequency variable characteristics of the VCO, respectively.

$$H(s) = \frac{K_p \times K_V \times F(s)}{s + K_p \times K_V \times F(s)/N_{DIV}} \quad (2)$$

Figure 9:
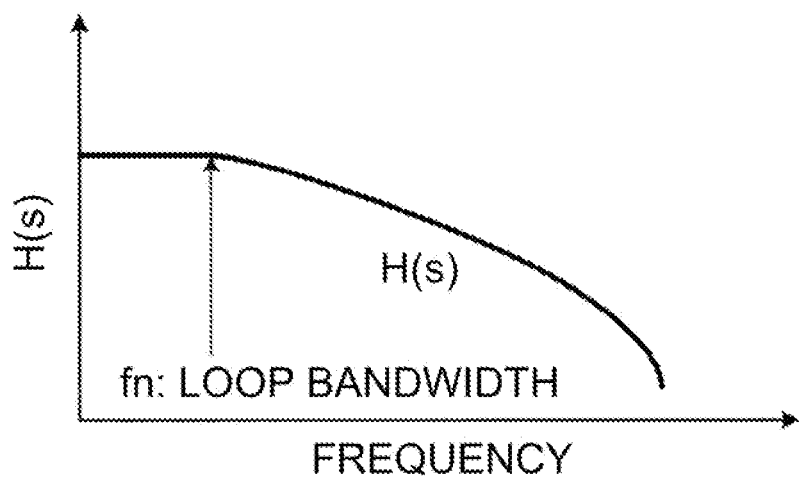
FIG. 9 is a diagram illustrating a relationship between a PLL circuit control loop characteristic and a frequency.

FIG. 9 illustrates a relationship between H(s), hereinafter referred to the PLL circuit control loop characteristic, represented by Equation 2 and the frequency of the signal oscillated by the signal oscillator. In FIG. 9, a vertical axis represents the PLL circuit control loop characteristic and a horizontal axis represents the frequency. As illustrated in FIG. 9, the PLL circuit control loop characteristic H(s) keeps a constant value until a predetermined frequency and then decreases with an increase in the frequency. A loop band width is a frequency band width in which the PLL circuit control loop characteristic H(s) keeps a constant value. A natural frequency $f_n$ which is the upper limit frequency in the loop band width is obtained from Equations 3 and 4 in which $\omega_n$ represents natural angular velocity and $A_0$ represents a constant determined by the loop filter.

$$\omega_n = \sqrt{\frac{K_p \times K_V}{N_{DIV} \times A_O}} \quad (3)$$

$$f_n = \frac{\omega_n}{2\pi} \quad (4)$$

According to Equation 3, since the related art PLL circuit includes a feedback division ratio $N_{DIV}$ as one of parameters that determine the loop band width, the PLL circuit control loop characteristic H(s) is also changed as the output frequency is switched.

Figure 10:
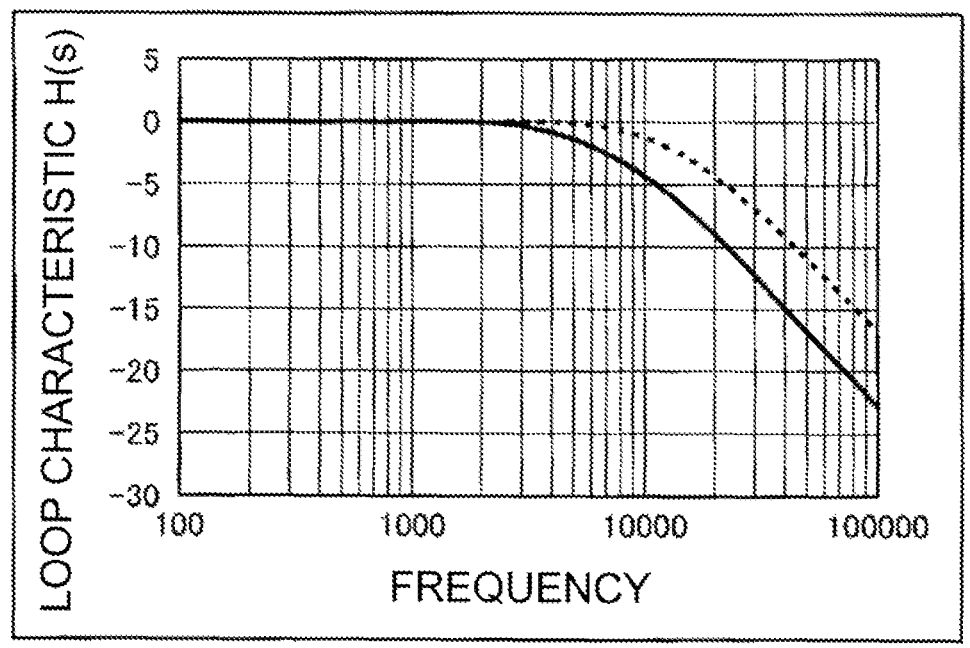
FIG. 10 is a diagram illustrating a related art problem.

FIG. 10 illustrates a problem of the related art technique. In particular, FIG. 10 illustrates a change in the PLL circuit control loop characteristic H(s) at a doubled output frequency. A vertical axis represents a PLL circuit control loop characteristic and a horizontal axis represents a frequency. A dotted line represents a change in the PLL circuit control loop characteristic H(s) at a predetermined output frequency whereas a solid line represents a change in the PLL circuit control loop characteristic H(s) at a doubled output frequency.

As illustrated by the solid line in FIG. 10, at the output frequency is doubled, the natural frequency is shifted toward a lower frequency side to narrow the loop band width as compared with the change in the PLL circuit control loop characteristic H(s) represented by the dotted line. At the doubled output frequency, the PLL circuit control loop characteristic H(s) is changed at a lower frequency side. As a result, following capability to the input REFCLK decreases and thus the switching of the output frequencies requires a longer time.

In view of the aforementioned, it is desired to provide a technique that a PLL circuit and a communication device may prevent a decrease in following capability during the switching of output frequencies.

Hereinafter, embodiments of a PLL circuit and a communication device disclosed will be described in detail with reference to the accompanying drawings.

First Embodiment

First, a configuration of a PLL circuit related to a first embodiment will be described with reference to FIG. 1.

Figure 1:
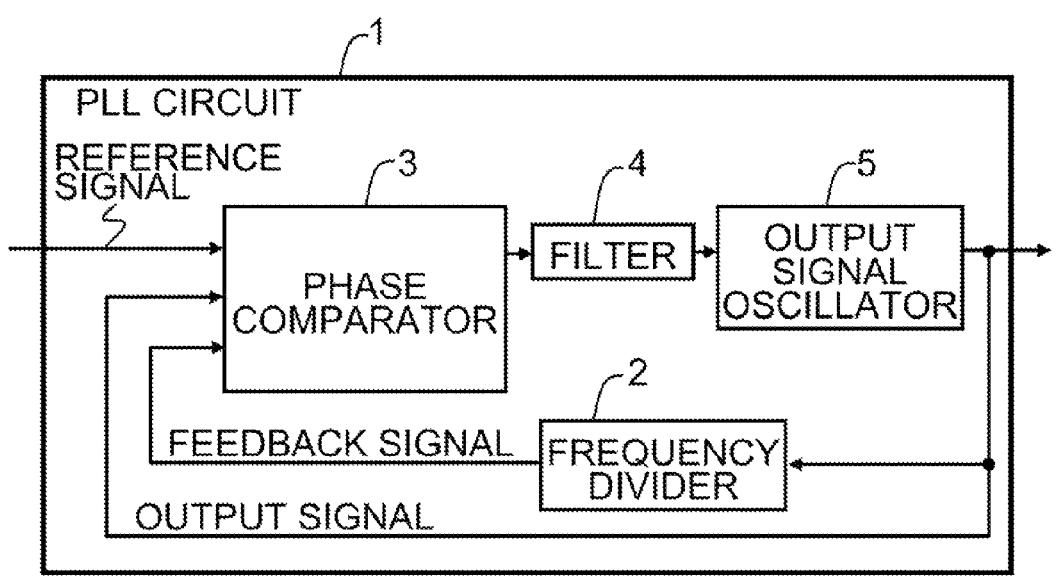
FIG. 1 is a diagram illustrating a configuration of a PLL circuit related to a first embodiment.

As illustrated in FIG. 1, a PLL circuit 1 includes a frequency divider 2, a phase comparator 3, a filter 4 and an output signal oscillator 5. The PLL circuit 1 generates an output signal in synchronization with a reference signal input from an unillustrated signal oscillator, and outputs the generated output signal to an unillustrated output destination.

The frequency divider 2 divides a feedback signal, which is a signal for the synchronization of phases of the reference signal and the output signal, by a predetermined division ratio. The phase comparator 3 compares phases of the reference signal and the feedback signal using the output signal and adjusts an output gain in accordance with an increase and decrease in the division ratio of the frequency divider 2 and then generates an output signal.

The filter 4 filters the output signal from the phase comparator 3. The output signal oscillator 5 generates an output signal in accordance with an analog signal output from the filter 4.

As described above, according to the first embodiment, the phase comparator gain $K_P$ is decreased when the feedback division ratio $N_{DIV}$ of the feedback signal divided by the frequency divider 2 becomes low whereas the phase comparator gain $K_P$ is increased when the feedback division ratio $N_{DIV}$ becomes high. Accordingly, the loop band width may be kept constant by eliminating fluctuations of the loop band width due to the increase and decrease in the division ratio during the switching of the frequencies of the output signal. Thus, a decrease in following capability during the switching of the output frequencies may be prevented.

Second Embodiment

Configuration of PLL Circuit of Second Embodiment

Figure 2:
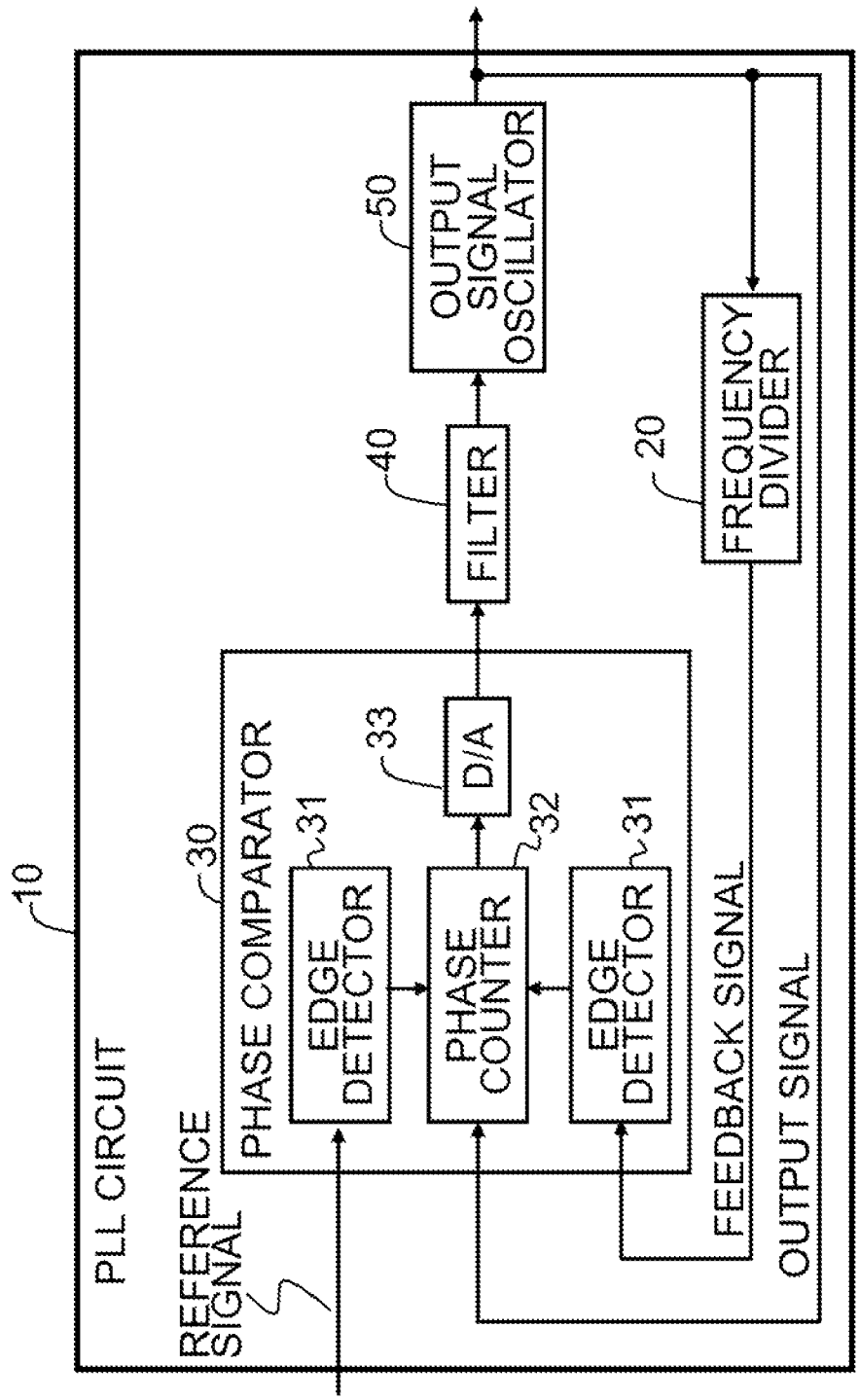
FIG. 2 is a diagram illustrating a configuration of a PLL circuit related to a second embodiment.

A PLL circuit 10 related to a second embodiment will be described with reference to FIGS. 2 to 6. FIG. 2 illustrates a configuration of the PLL circuit 10, in which the PLL circuit 10 includes a frequency divider 20, a phase comparator 30, a filter 40 and an output signal oscillator 50. The PLL circuit 10 generates an output signal in synchronization with a reference signal input from an unillustrated signal oscillator and outputs the generated output signal to an unillustrated output destination. The unillustrated signal oscillator is, for example, a crystal oscillator which provides a sine-wave output with a high degree accuracy. The unillustrated output destination is, for example, a mixer circuit which synthesizes a plurality of signals.

The frequency divider 20 divides the output signal by a predetermined division ratio for the synchronization of phases of the reference signal and the output signal. The frequency divider 20 outputs the divided output signal as the feedback signal to the phase comparator 30. The division ratio of the frequency divider 20 is controlled by an unillustrated controller. The division ratio may be determined automatically in accordance with a frequency band to be used or may be determined arbitrarily by an administrator of the PLL circuit.

The filter 40 is a low pass filter (LPF) to filter an analog output signal generated by the phase comparator 30 which will be described later.

In response to an input of a current as an analog signal from a later-described DA converter 33, the filter 40 integrates the input current to thereby convert the analog signal into voltage. The filter 40 then outputs the converted analog signal to a later-described output signal oscillator 50.

The output signal oscillator 50 generates an output signal in accordance with the analog signal filtered by the filter 40. The output signal oscillator 50 is, for example, a voltage controlled oscillator (VCO) which generates an output signal in accordance with an analog signal generated by filtering of the LPF.

The phase comparer 30 compares phases of the reference signal and the feedback signal using the output signal and adjusts an output gain of the analog signal for the generation of an output signal following an increase and decrease in the division ratio of the frequency divider 20. As illustrated in FIG. 2, the phase comparator 30 includes an edge detector 31, a phase counter 32 and a DA converter 33.

The edge detector 31 detects rising edges and falling edges of the feedback signal and the reference signal. In particular, the edge detector 31 detects rising edges and falling edges of the feedback signal input from the frequency divider 20 and rising edges and falling edges of the reference signal input from an unillustrated signal oscillator. The edge detector 31 then sends the detected edges to a phase counter 32 described below.

The phase counter 32 counts the number of pulses of the output signals between rising edges or between falling edges detected by the edge detector 31. In particular, the phase counter 32 counts the number of pulses of the output signals between a rising edge of the reference signal and a rising edge of the feedback signal detected by the edge detector 31. Alternatively, the phase counter 32 counts the number of pulses of the output signals between a falling edge of the reference signal and a falling edge of the feedback signal detected by the edge detector 31.

Figure 3:
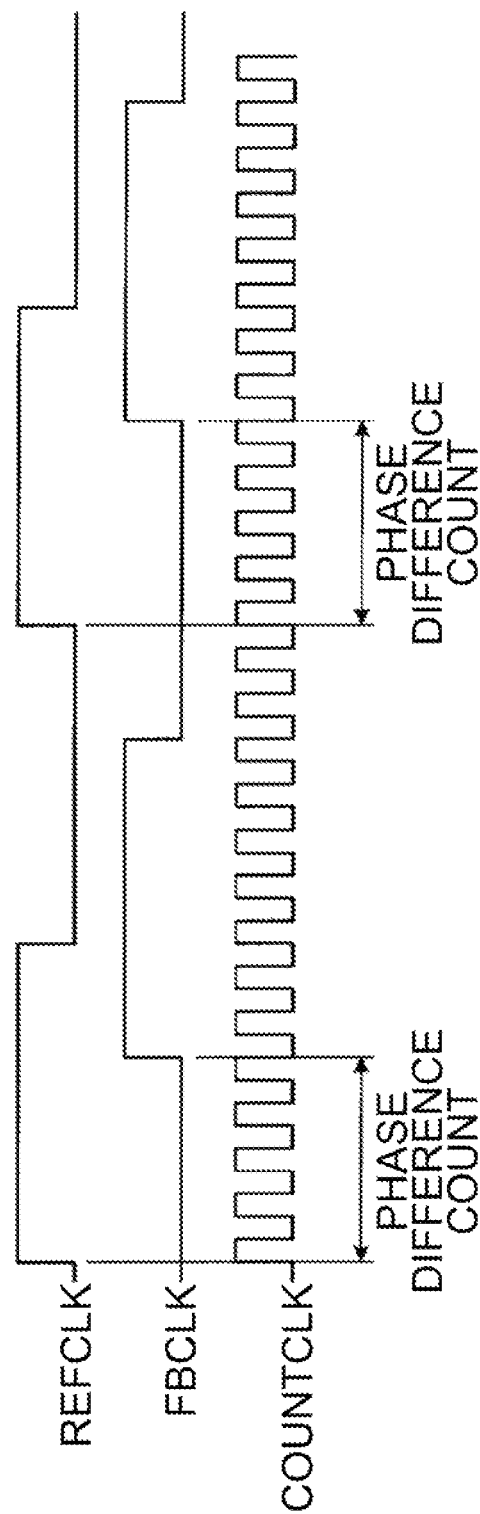
FIG. 3 is a diagram illustrating an edge detector and a phase counter.

FIG. 3 illustrates the edge detector 31 and the phase counter 32. In FIG. 3, the horizontal direction represents a time axis and REFCLK is a reference signal input from an unillustrated signal oscillator. FBCLK is a feedback signal input via the frequency divider 20 and COUNTCLK is an output signal input from the output signal oscillator 50. As illustrated in FIG. 3, each signal repeats rising and falling in different cycles.

For example, as illustrated in FIG. 3, the phase counter 32 counts the number of pulses ("phase difference count") of the output signals (COUNTCLK) between a rising edge of the reference signal (REFCLK) and a rising edge of the feedback signal (FEBCLK) detected by the edge detector 31. Referring for example to FIG. 3, the phase counter 32 takes 4 as the phase difference count between a first rising of REFCLK and a first rising of FEBCLK. Similarly, the phase counter 32 takes 4 as the phase difference count between a second rising of REFCLK and a second rising of FEBCLK.

Referring again to FIG. 2, the DA converter 33 outputs a current or voltage in accordance with the number of pulses counted by the phase counter 32. In particular, the DA converter 33 outputs the voltage or current to the filter 40 in correspondence with the number of pulses counted by the phase counter 32.

Figure 4:
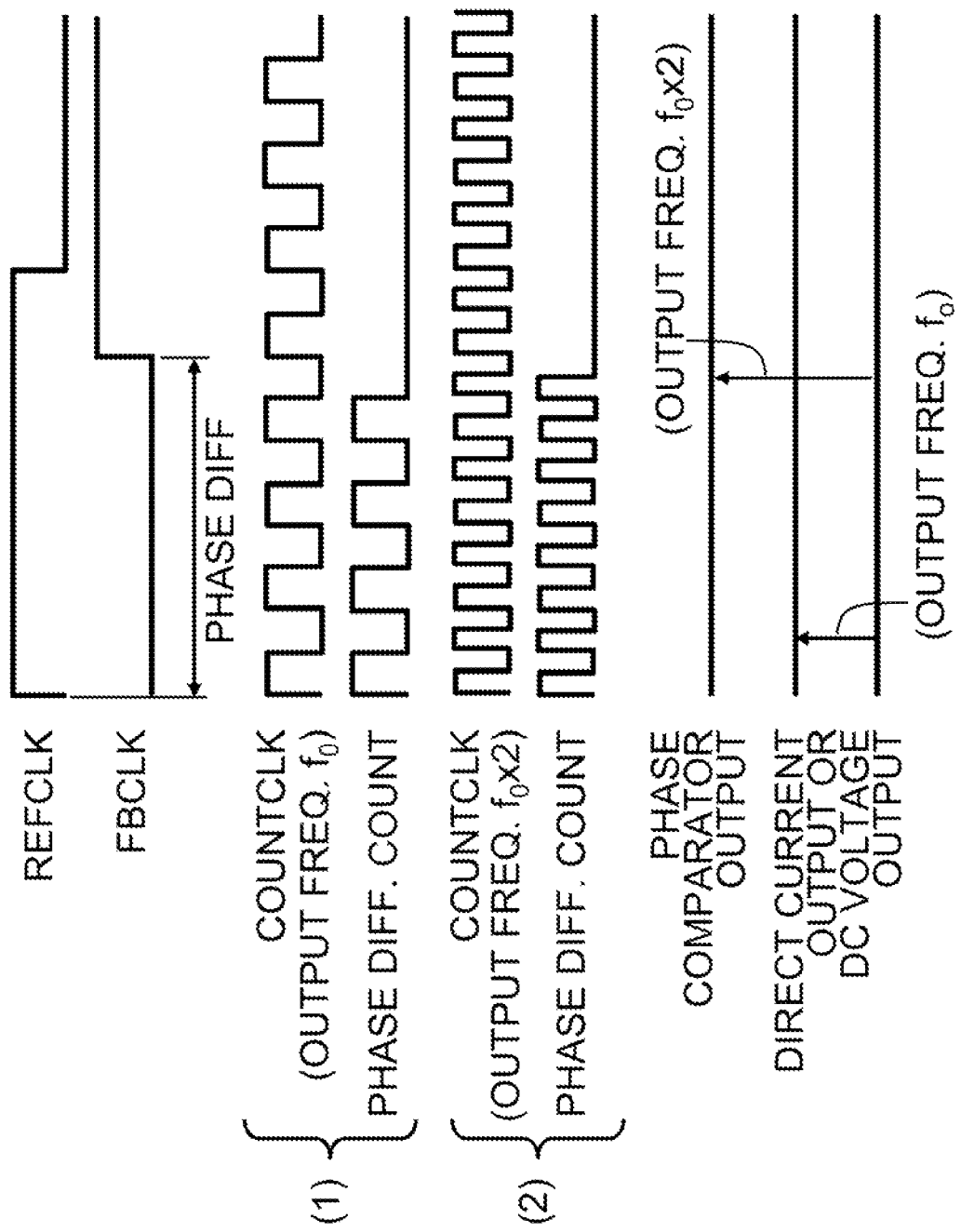
FIG. 4 is a diagram explaining a DA converter.

FIG. 4 illustrates a diagram for explaining the DA converter 33. In FIG. 4, the horizontal direction represents a time axis and REFCLK represents the reference signal input to the edge detector 31 from an unillustrated signal oscillator. FBCLK represents the feedback signal input to the edge detector 31 via the frequency divider 20. COUNTCLK represents an output signal of a predetermined output frequency $f_0$ input to the phase counter 32 from the output signal oscillator 50. COUNTCLK represents an output signal at a doubled frequency of the predetermined output frequency $f_0$. The phase difference count represents the number of pulses of COUNTCLK or COUNTCLK counted by the phase counter 32 between a rising of REFCLK and a rising of FBCLK. The phase comparator output represents an amount of output of a direct current or direct current voltage output from the phase comparator 30 in accordance with the number of pulses counted by the phase counter 32. As illustrated in FIG. 4, REFCLK, FBCLK, COUNTCLK (output frequency $f_0$) and COUNTCLK (output frequency $f_0 \times 2$) each repeat rising and falling in different cycles.

For example, as illustrated in (1) in FIG. 4, when the phase counter 32 takes 4 as the phase difference count for COUNTCLK of the output frequency $f_0$, the DA converter 33 outputs a direct current or direct current voltage of the output frequency $f_0$ as the phase comparator output. As illustrated in (2) in FIG. 4, when the phase counter 32 takes 8 as the phase difference count for COUNTCLK of the output frequency $f_0 \times 2$, the DA converter 33 outputs a direct current or direct current voltage of the output frequency $f_0 \times 2$ as the phase comparator output. Thus, the DA converter 33 outputs a doubled direct current or doubled direct current voltage at a doubled output frequency of COUNTCLK.

Figure 5:
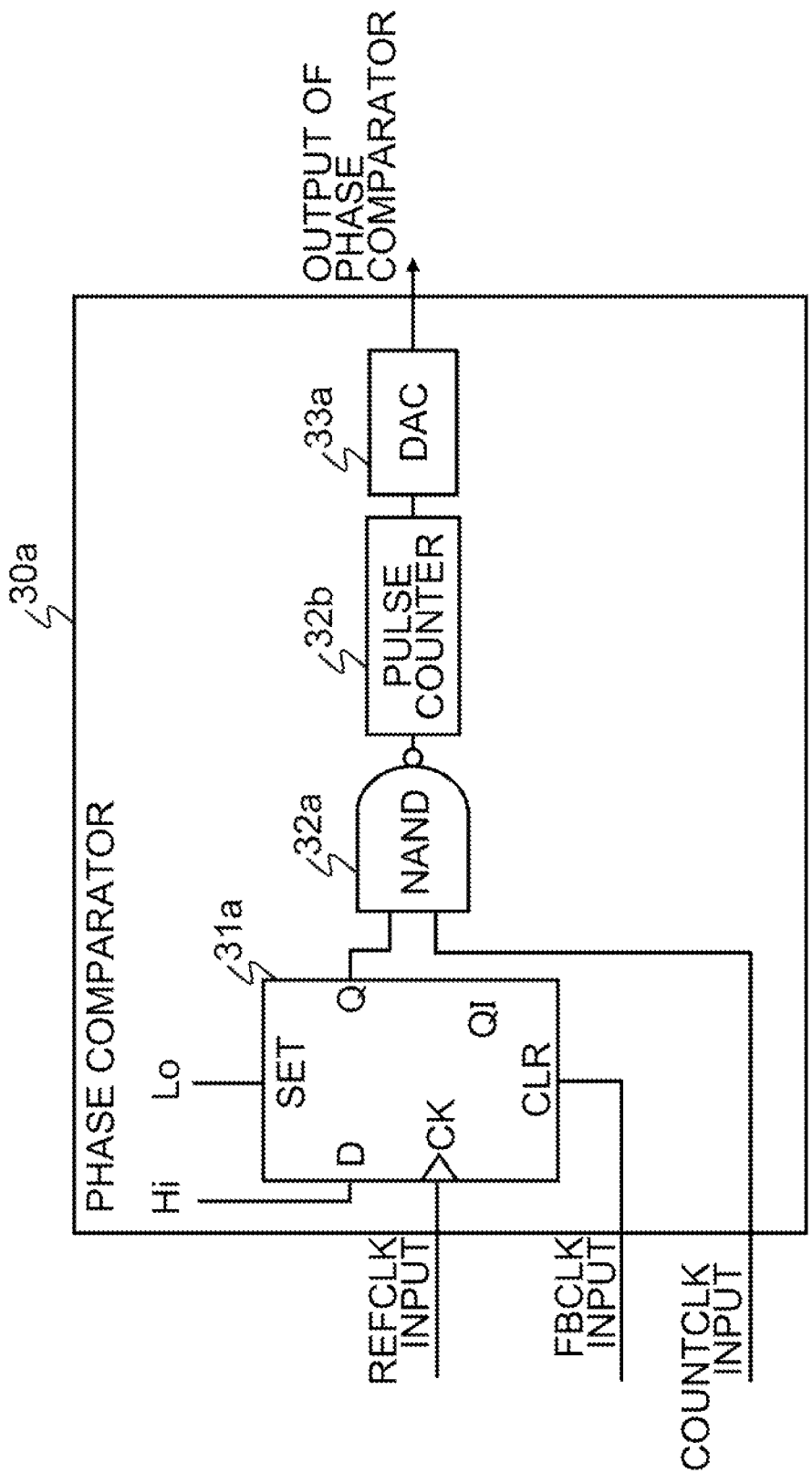
FIG. 5 is a diagram illustrating an exemplary phase comparator related to the second embodiment.

Hereinafter, an exemplary phase comparator which causes the phase comparator described above to operate will be described. FIG. 5 illustrates an exemplary phase comparator related to the second embodiment. As illustrated in FIG. 5, a phase comparator 30a which causes the phase comparator described above to operate includes a D-type flip flop circuit (D-FF) 31a, a NAND circuit 32a and a pulse counter 32b. The D-FF 31a functions as the edge detector 31, and the NAND circuit 32a and the pulse counter 32b function as the phase counter 32. The phase comparator 30a includes a digital-to-analog converter (DAC) 33a which functions as the DA converter 33.

The D-FF 31a continuously outputs a predetermined signal in a phase difference section between a rising edge of the reference signal and a rising edge of the feedback signal whereas continuously outputs a signal different from the predetermined signal in sections other than the phase difference section. For example, the D-FF 31a continuously outputs, from a Q terminal, a value Hi:1 input from a D terminal at a rising edge of REFCLK input from a CK terminal as illustrated in FIG. 5. The D-FF 31a continuously outputs, from the Q terminal, a value Lo:0 input from a SET terminal at a rising edge of FBCLK input from a CLR terminal.

That is, the D-FF 31a outputs the value 1 as a high level in the phase difference section between a rising edge of REFCLK and a rising edge of FBCLK and outputs the value Lo as a low level in sections other than the phase difference section. QI represents an inverse of Q.

The NAND circuit 32a compares a signal output from a flip-flop with a predetermined signal and, when the signals are coincident, outputs a signal different from the predetermined signal. For example, the NAND circuit 32a compares a signal output from the D-FF 31a with COUNTCLK and, when both the signals are 1, outputs 0.

The pulse counter 32b counts output pulses of a signal output from the NAND circuit 32a. In particular, the pulse counter 32b counts the number of pulses input in a predetermined period and outputs the number of the counted pulses.

For example, the pulse counter 32b counts and outputs the number of 0s output from the NAND circuit 32a in a predetermined period.

The DAC 33a generates an analog signal in accordance with the number of output pulses counted by the pulse counter 32b. For example, the DAC 33a generates a direct current in accordance with the number of 0s counted by the pulse counter 32b and outputs the generated direct current.

Figure 6:
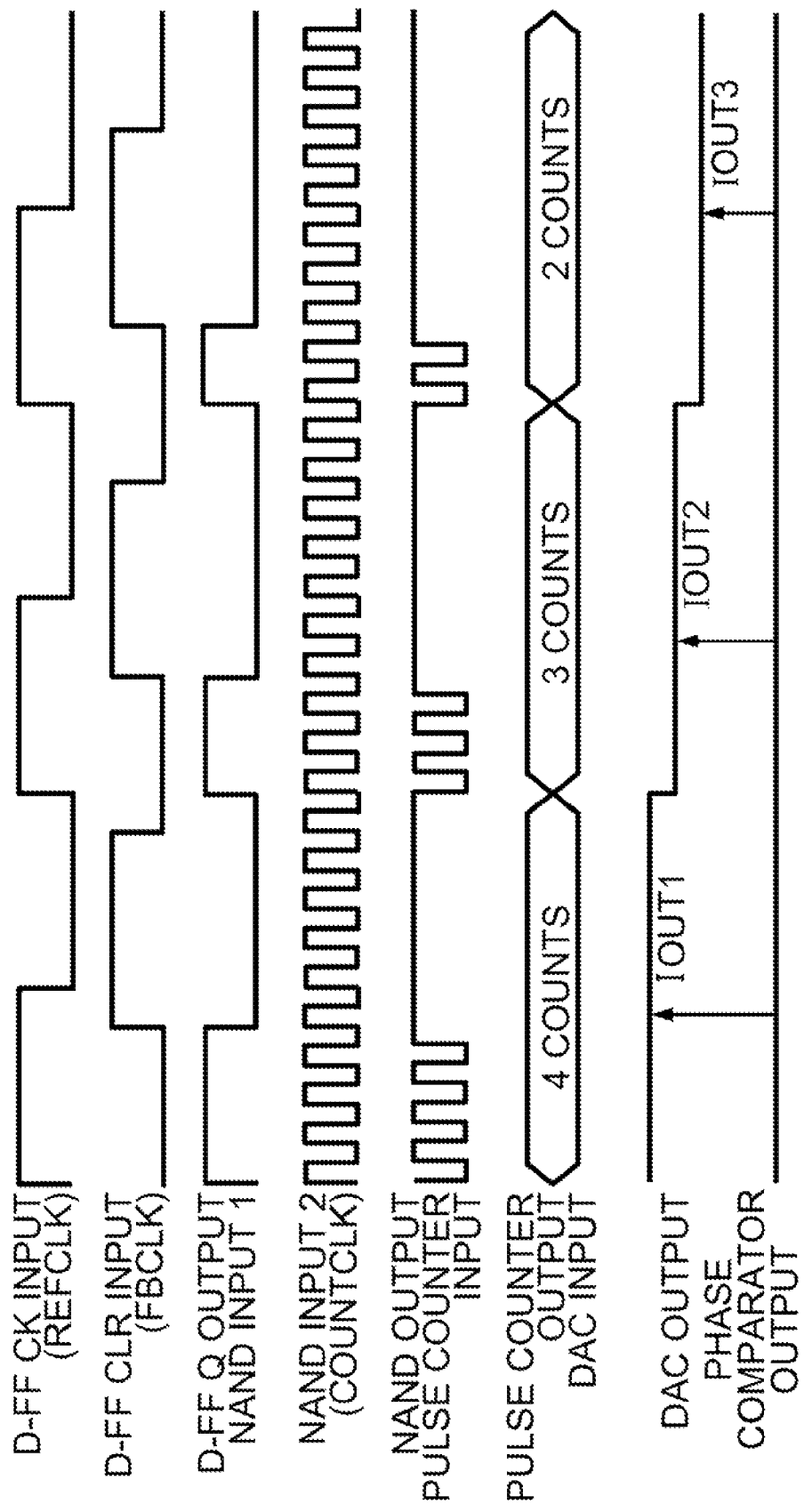
FIG. 6 is a diagram explaining exemplary output of the phase comparator.

Exemplary output of the phase comparator 30a will be described with reference to FIG. 6. In FIG. 6, the horizontal direction represents a time axis and D-FF CK input (REFCLK) represents a reference signal input to the CK terminal of the D-FF 31a from an unillustrated signal oscillator. D-FF CLR input (FBCLK) represents a feedback signal input to the CLR terminal of the D-FF 31a and D-FF Q output (NAND input 1) represents a signal output from the Q terminal of the D-FF 31a and input to the NAND circuit 32a. NAND input 2 (COUNTCLK) represents an output signal input to the NAND circuit 32a. As illustrated in FIG. 6, the signals repeat rising and falling in different cycles.

NAND output (pulse counter input) represents a signal output from the NAND circuit 32a and input to the pulse counter 32b. Pulse counter output (DAC input) represents a signal output from the pulse counter 32b and input to the DAC 33a. DAC output (phase comparator output) represents a signal output from the DAC 33a in response to a signal output from the pulse counter 32b, i.e., an analog signal output from the phase comparator 30a.

For example, as illustrated in FIG. 6, when REFCLK is input from the CK terminal of the D-FF 31a and FBCLK is input from the CLR terminal of the D-FF 31a, the D-FF 31a outputs a signal represented by D-FF Q output (NAND input 1) in FIG. 6 from the Q terminal. That is, the D-FF 31a outputs, from the Q terminal, a signal which has a value 1 only in a section between a rising edge of REFCLK and a rising edge of FBCLK.

The NAND circuit 32a compares the signal represented by D-FF Q output (NAND input 1) in FIG. 6 input from the D-FF 31a with the signal represented by NAND input 2 (COUNTCLK) in FIG. 6. Only when both D-FF Q output (NAND input 1) and NAND input 2 (COUNTCLK) are 1, the NAND circuit 32a outputs a signal represented by NAND output (pulse counter input) on which 0 is output.

The pulse counter 32b counts the number of 0s output in a predetermined period using the signal represented by NAND output (pulse counter input) which is input from the NAND circuit 32a, and outputs the counted number as represented by pulse counter output (DAC input) in FIG. 6. For example, if four 0s are output in a predetermined period, the pulse counter 32b outputs the count of 4. Similarly, if three or two 0s are output in a predetermined period, the pulse counter 32b outputs the count of 3 or 2.

The DAC 33a outputs a direct current in accordance with the output number of 0s counted by the pulse counter 32b as the output of the phase comparator 30a. For example, the DAC 33a outputs a direct current of IOUT1 represented by DAC output (phase comparison output) in FIG. 6 as the output of the phase comparator 30a in accordance with the count of 4 output from the pulse counter 32b. Similarly, the DAC 33a outputs a direct current of IOUT2 or IOUT3 represented by DAC output-phase comparison output in FIG. 6 as the output of the phase comparator 30a in accordance with the count of 2 or 3 output from the pulse counter 32b. IOUT represents an output terminal of the DAC 33a.

It should be noted that the phase comparator 30a described above is illustrative only and circuits or units other than those illustrated in FIG. 5 may also be employed as the phase comparator 30a which causes the phase comparator 30 related to the present embodiment to operate. In the embodiment described above, the number of pulses of the output signals between a rising edge of the reference signal and a rising edge of the feedback signal is counted. However, the present embodiment is not limited to the same and the number of pulses of the output signals between a falling edge of the reference signal and a falling edge of the feedback signal may alternatively be counted.

As described above, according to the second embodiment, the frequency divider 20 divides the feedback signal, which is a signal for the synchronization of phases of a reference signal and an output signal, by a predetermined division ratio. The edge detector 31 detects rising edges or falling edges of the feedback signal and the reference signal divided by the frequency divider 20. The phase counter 32 counts the number of pulses of the output signals between rising edges or between falling edges detected by the edge detector 31. The DA converter 33 generates an output signal in accordance with the number of pulses counted by the phase counter 32. The output signal oscillator 50 generates an output signal in accordance with an analog signal filtered by the filter 40. With this configuration, the loop band width may be kept constant and a decrease in following capability during the switching of output frequency may be prevented.

Here, it will be explained with reference to Equations 5 to 9 that the phase comparator 30 adjusts the gain to keep the loop band width constant by the configuration described above even if the division ratio is increased or decreased during the switching of the output frequency. First, the gain $K_P$ of the phase comparator 30 in the present embodiment is expressed by Equation 5 as the multiplication of $K_{CNT}$, which is the gain of the phase counter 32, and $K_{DAC}$, which is the conversion gain of the DA converter 33.

$$K_P = K_{CNT} \times K_{DAC} \quad (5)$$

The gain $K_{CNT}$ of the phase counter 32 may be expressed as Equation 6 using a phase comparison frequency $f_{DPD}$ and the output frequency $f_{OUT}$.

$$K_{CNT} = \frac{f_{OUT}}{f_{DPD} \times 2\pi} \quad (6)$$

The conversion gain $K_{DAC}$ of the DA converter 33 may be expressed as Equation 7 using the maximum output current $I_{OUTMAX}$ of the DA converter 33 and an input bit number Bin of the DA converter 33.

$$K_{DAC} = \frac{I_{OUTMAX}}{2^{Bin}} \quad (7)$$

Thus, the natural angular velocity $\omega_n$ represented by Equation 3 may be expressed as Equation 8 using Equations 5 to 7.

$$\omega_n = \sqrt{\frac{K_P \times K_V}{N_{DIV} \times A_o}} = \sqrt{\frac{K_{CNT} \times K_{DAC} \times K_V}{N_{DIV} \times A_o}} \quad (8)$$

$$= \sqrt{f_{OUT} \frac{I_{OUTMAX}}{2\pi \times f_{DPD} \times 2^{Bin}} \times \frac{K_V}{N_{DIV} \times A_o}}$$

Here, as represented by a derivation process in Equation 8, even if the feedback division ratio $N_{DIV}$ is changed during the switching of the output frequency, the change may be canceled by an adjustment of $K_{CNT}$, which is the gain of the phase counter 32, following the increase and decrease in the division ratio. That is, since the increase and decrease in the natural angular velocity $\omega_n$ accompanying the increase and decrease in the division ratio is eliminated, the natural frequency $f_n$ which is the upper limit frequency of the loop band width undergoes no change and thus the loop band width can be kept constant (see Equation 4).

The natural angular velocity $\omega_n$ represented by Equation 8 may further be expressed as Equation 9 using Equation 1.

$$\omega_n = \sqrt{f_{IN} \frac{I_{OUTMAX}}{2\pi \times f_{DPD} \times 2^{Bin}} \times \frac{K_V}{A_o}} \quad (9)$$

As represented by Equation 9, the output frequency $f_{OUT}$ and the feedback division ratio $N_{DIV}$ may be eliminated from the parameters of the natural angular velocity $\omega_n$ by the means of the present embodiment. Thus, since the loop band width is kept constant even if the output frequency is switched, the PLL circuit control loop characteristic H(s) undergoes no change and thereby a decrease in following capability during the switching of output frequency may be prevented.

According to the second embodiment, the DA converter 33 converts the number of pulses counted by the phase counter 32 into a current or voltage. Thus, the PLL circuit of the second embodiment may be implemented only through modification of a phase comparator of a related art PLL circuit.

According to the second embodiment, the edge detector 31 is a flip-flop which continuously output a predetermined signal in the phase difference section between a rising edge of the reference signal and a rising edge of the feedback signal whereas continuously outputs a signal different from the predetermined signal in sections other than the phase difference section. The phase counter 32 is a NAND circuit which compares a signal output from a flip-flop with a predetermined signal and, when the signals are coincident, outputs a signal different from the predetermined signal. The phase counter 32 is also a pulse counter which counts the number of pulses of a signal output from the NAND circuit. The DA converter 33 is a DA converter unit which generates an analog signal in accordance with the number of pulses of the output signal counted by the pulse counter. Accordingly, the PLL circuit of the second embodiment may be implemented using related art circuit configuration elements.

Third Embodiment

In the second embodiment, a PLL circuit in which a phase comparator follows an increase and decrease in a division ratio has been described. In a third embodiment, a communication device which incorporates the above-described PLL circuit will be described. Examples of the communication device include wireless communication devices and optical transmission devices, each of which incorporates a PLL circuit for the switching of frequencies of output signals. For example, a communication device used for wireless communication, such as for mobile phones, is applied to a PLL circuit that generates a carrier frequency in a base station.

Configuration of Communication Device of Third Embodiment

Figure 7:
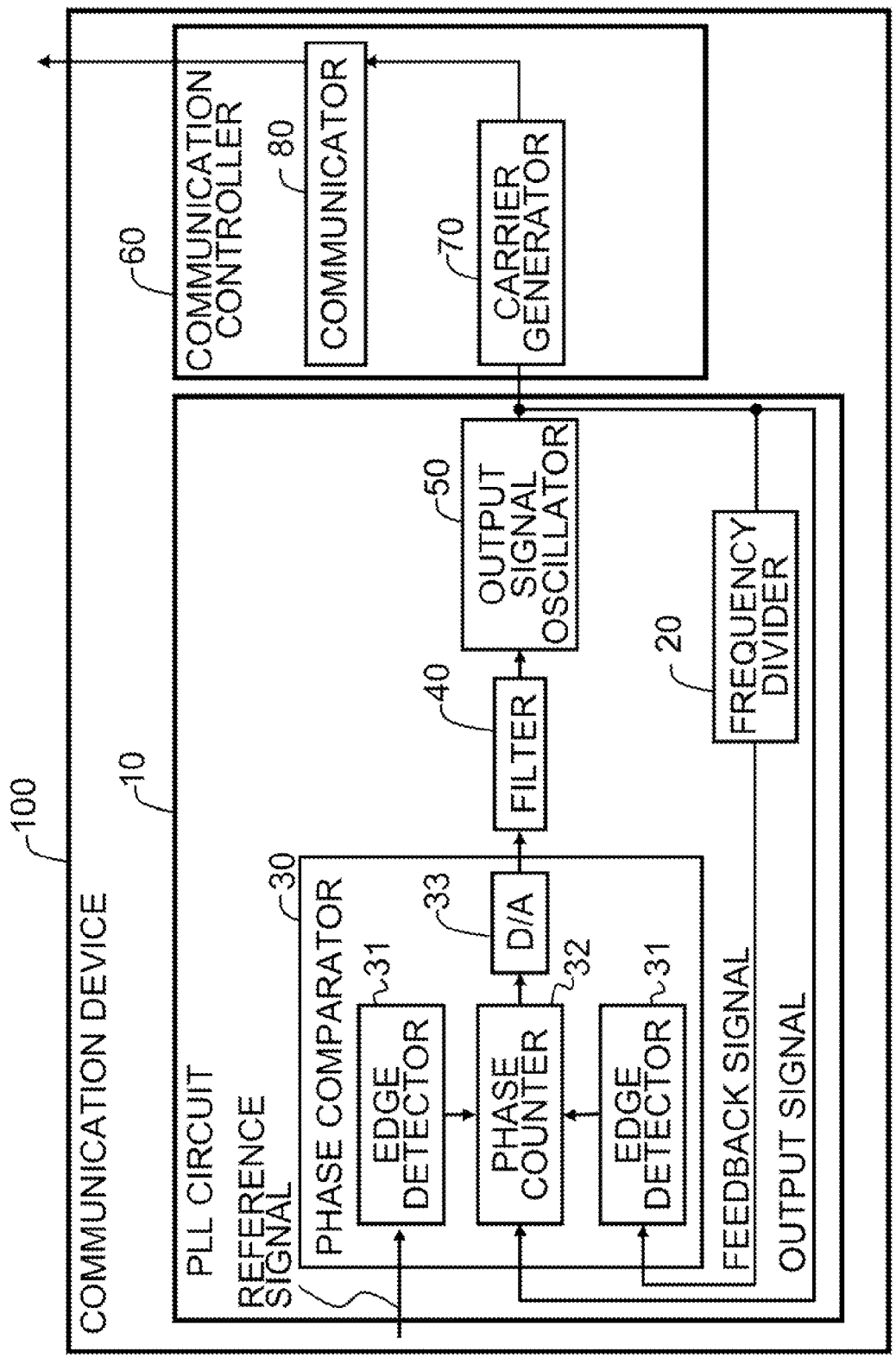
FIG. 7 is a diagram illustrating a communication device related to a third embodiment.
Figure 8:
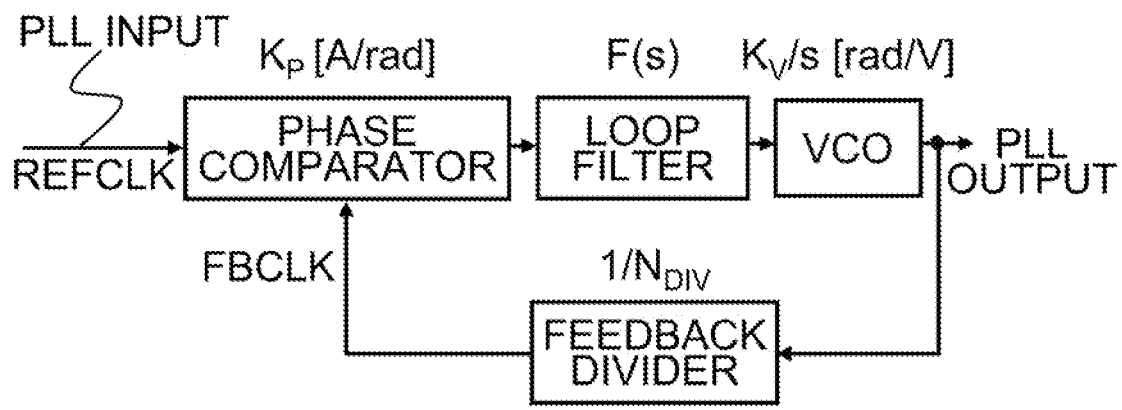
FIG. 8 is a diagram illustrating a related art PLL circuit.

First, a configuration of the communication device related to the third embodiment will be described with reference to FIG. 7. As illustrated in FIG. 7, a communication device 100 includes the PLL circuit 10 related to the second embodiment and a communication controller 60. The communication device 100 communicates using output signals oscillated by the PLL circuit 10. Since the configuration and process details of the PLL circuit 10 are the same as those of the second embodiment, a detailed description thereof will be omitted.

The phase comparator 30 of the PLL circuit 10 generates an analog signal of which gain has been adjusted following an increase and decrease in a division ratio using a reference signal, a feedback signal and an output signal. The feedback signal is divided by the frequency divider 20 by a predetermined division ratio. The output signal is generated by the output signal oscillator 50. The filter 40 filters the analog signal generated by the phase comparator 30. The output signal oscillator 50 oscillates an output signal of a frequency in accordance with voltage input from the filter 40. The division ratio of the frequency divider 20 is suitably controlled by an unillustrated controller so that a carrier output from the communication device is kept in an optimal frequency.

The communication controller 60 includes a carrier generator 70 and a communicator 80. The communication controller 60 generates carriers in accordance with an output signal generated by the output signal oscillator 50 and controls a communication process using the generated carriers.

The carrier generator 70 generates carriers in accordance with the output signals generated by the output signal oscillator 50. In particular, the carrier generator 70 generates carriers carrying different data on output signals for each of different frequencies generated by the output signal oscillator 50.

The communicator 80 controls the carriers generated by the carrier generator 70 to be transmitted from predetermined output terminals. For example, the communicator 80 controls the carriers generated by the carrier generator 70 to be transmitted from an antenna.

That is, in the communication device 100 related to the third embodiment, the PLL circuit 10 oscillates an output signal using an analog signal generated in accordance with the number of pulses of the output signal between a rising edge of the reference signal and a rising edge of the feedback signal. The carrier generator 70 generates a carrier which carries data on the output signal oscillated by the PLL circuit 10. The communicator 80 transmits the carrier generated by the carrier generator 70. For example, the communicator 80 transmits the carrier generated by the carrier generator 70 from an antenna.

As described above, according to the third embodiment, the frequency divider 20 divides a feedback signal, which is a signal for the synchronization of phases of a reference signal and an output signal, by a predetermined division ratio. The edge detector 31 detects rising edges and falling edges of the feedback signal and the reference signal divided by the frequency divider 20. The phase counter 32 counts the number of pulses of the output signals between rising edges or falling edges detected by the edge detector 31. The DA converter 33 generates an output signal in accordance with the number of pulses counted by the phase counter 32. The filter 40 filters an analog signal generated by the DA converter 33. The output signal oscillator 50 generates an output signal in accordance with the analog signal filtered by the filter 40. The communication controller 60 generates a carrier in accordance with the output signal generated by the output signal oscillator and performs communications using the generated carrier. In this manner, a communication device is implemented in which a decrease in following capability during the switching of the output frequencies can be prevented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A phase locked loop circuit comprising:
   a frequency divider configured to divide a feedback signal by a specific ratio, the feedback signal being used for synchronizing a phase of a reference signal and a phase of an output signal;
   a phase comparator configured to compare the phases of the reference signal, the output signal, and the feedback signal and to adjust a gain of an analog signal so that the gain is decreased when the ratio is decreased and the gain is increased when the ratio is increased, the analog signal being used for generating the output signal;
   a filter configured to filter the analog signal to pass signals in a specific frequency band, the gain of the analog signal having been adjusted by the phase comparator; and
   an output signal oscillator configured to generate the output signal on the basis of the analog signal filtered by the filter, the output signal being provided directly from the output signal oscillator to the phase comparator.

2. A phase locked loop circuit comprising:
   a frequency divider configured to divide a feedback signal by a specific ratio, the feedback signal being used for synchronizing a phase of a reference signal and a phase of an output signal;
   an edge detector configured to detect rising edges of the reference signal and the feedback signal divided by the frequency divider or falling edges of the reference signal and the feedback signal divided by the frequency divider;
   a phase counter configured to count the number of pulses of the output signal between two of the rising edges adjacent each other or two of the falling edges adjacent each other, one of the rising edges being of the reference signal and the other of the rising edges being of the feedback signal, one of the falling rising edges being of the reference signal and the other of the falling edges being of the feedback signal;
   a digital to analog converter configured to adjust a gain of an analog signal on the basis of the number of pulses counted by the phase counter, the analog signal being used for generating the output signal;
   a filter configured to filter the analog signal to pass signals in a specific frequency band, the gain of the analog signal having been adjusted by the digital to analog converter; and
   an output signal oscillator configured to output the output signal on the basis of the analog signal filtered by the filter.

3. The phase locked loop circuit according to claim 2, wherein the digital to analog converter converts the number of pulses to a corresponding current value or a corresponding voltage value.

4. The phase locked loop circuit according to claim 2, wherein
   the edge detector is a flip flop which continuously outputs a specific signal between at the rising edge of the reference signal and at the rising edge of the feedback signal, which is adjacent to the rising edge of the reference signal, and continuously outputs a signal different from the specific signal except between at the rising edge of the reference signal and at the rising edge of the feedback signal,
   the phase counter includes a NAND and a pulse counter wherein
   the NAND compares a signal output from the flip flop and the output signal and outputs a signal different from the specific signal when the output signal is equal to the specific signal and
   the pulse counter counts the number of pulses output from the NAND,
   the digital to analog converter is a digital to analog converter which generates an analog signal on the basis of the number of pulses.

5. A communication device comprising:
   a frequency divider configured to divide a feedback signal by a specific ratio, the feedback signal being used for synchronizing a phase of a reference signal and a phase of an output signal;
   an edge detector configured to detect rising edges of the reference signal and the feedback signal divided by the frequency divider or falling edges of the reference signal and the feedback signal divided by the frequency divider;
   a phase counter configured to count the number of pulses of the output signal between two of the rising edges adjacent each other or two of the falling edges adjacent each other, one of the rising edges being of the reference signal and the other of the rising edges being of the feedback signal, one of the falling rising edges being of the reference signal and the other of the falling edges being of the feedback signal;
   a digital to analog converter configured to adjust a gain of an analog signal on the basis of the number of pulses counted by the phase counter, the analog signal being used for generating the output signal;
   a filter configured to filter the analog signal to pass signals in a specific frequency band, the gain of the analog signal having been adjusted by the digital to analog converter; and
   an output signal oscillator configured to output the output signal on the basis of the analog signal filtered by the filter; and
   a communication controller configured to generate a carrier on the basis of the output signal generated by the digital to analog converter and control a communication processing by using the generated carrier.

6. The communication device according to claim 5, wherein the digital to analog converter converts the number of pulses to a corresponding current value or a corresponding voltage value.

7. The communication device according to claim 5, wherein
   the edge detector is a flip flop which continuously outputs a specific signal between at the rising edge of the reference signal and at the rising edge of the feedback signal which is adjacent to the rising edge of the reference signal and continuously outputs a signal different from the specific signal except between at the rising edge of the reference signal and at the rising edge of the feedback signal, the phase counter includes a NAND and a pulse counter wherein the NAND compares a signal output from the flip flop and the output signal and outputs a signal different from the specific signal when the output signal is equal to the specific signal and the pulse counter counts the number of pulse outputs output from the NAND, the digital to analog converter is a digital to analog converter which generates an analog signal on the basis of the number of pulse outputs.

\* \* \* \* \*